(12) United States Patent
Tammi et al.

(10) Patent No.: US 10,014,841 B2
(45) Date of Patent: Jul. 3, 2018

(54) METHOD AND APPARATUS FOR CONTROLLING AUDIO PLAYBACK BASED UPON THE INSTRUMENT

(71) Applicant: Nokia Technologies Oy, Espoo (FI)

(72) Inventors: Mikko Tapio Tammi, Tampere (FI); Arto Juhani Lehtiniemi, Lempäälä (FI); Lasse Juhani Laaksonen, Tampere (FI); Miikka Tapani Vilermo, Siuro (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/269,375

(22) Filed: Sep. 19, 2016

(65) Prior Publication Data

US 2018/0083587 A1     Mar. 22, 2018

(51) Int. Cl.
    *H03G 3/00*      (2006.01)
    *H03G 7/00*      (2006.01)
    *G06F 3/16*      (2006.01)

(52) U.S. Cl.
    CPC ............ *H03G 7/007* (2013.01); *G06F 3/165* (2013.01)

(58) Field of Classification Search
    CPC ....................................................... H03G 3/00
    See application file for complete search history.

(56) References Cited

U.S. PATENT DOCUMENTS

| | | | |
|---|---|---|---|
| 5,907,823 A | 5/1999 | Sjoberg et al. | |
| 7,612,275 B2 | 11/2009 | Seppanen et al. | |
| 2005/0089177 A1 | 4/2005 | Hughes et al. | |
| 2006/0117261 A1 * | 6/2006 | Sim ...................... | G10H 1/0066 715/727 |
| 2007/0121965 A1 | 5/2007 | Joseph et al. | |
| 2011/0095875 A1 | 4/2011 | Thyssen et al. | |

(Continued)

FOREIGN PATENT DOCUMENTS

| | | |
|---|---|---|
| EP | 0 632 586 A1 | 1/1995 |
| GB | 2 522 644 A | 8/2015 |
| GB | 2 533 654 A | 6/2016 |
| WO | WO 02/071603 A1 | 9/2002 |
| WO | WO 2005/106843 A1 | 11/2005 |
| WO | WO 2008/076517 A1 | 6/2008 |

(Continued)

OTHER PUBLICATIONS

Dolby Atmos Audio Technology [online] [retrieved Dec. 7, 2016]. Retrieved from the Internet: <URL: https://www.dolby.com/us/en/brands/dolby-atmos.html>. 4 pages.

(Continued)

*Primary Examiner* — Olisa Anwah
(74) *Attorney, Agent, or Firm* — Alston & Bird LLP

(57) ABSTRACT

A method, apparatus and computer program product are provided to adjust audio file playback in terms of volume and/or compression. By example, a method separates an audio file into tracks, each attributable to a different instrument. The method also determines the instrument for which the audio signals are dominant or loudest and accesses settings for the volume preference of the audio signals attributable to each different instrument. The method modifies the setting for the volume preference of the audio signals attributable to the instrument that is dominant or loudest based on user input altering a volume at which the audio file is output without modification of the setting for the volume preference of the audio signals attributable to another instrument. The method also amplifies or attenuates audio signals based upon the modified setting.

20 Claims, 6 Drawing Sheets

(56) References Cited

U.S. PATENT DOCUMENTS

2012/0039489 A1 2/2012 Chen et al.
2015/0016614 A1* 1/2015 Buyens .................... H04R 5/04
                                                      381/27
2015/0207481 A1 7/2015 Duwenhorst et al.

FOREIGN PATENT DOCUMENTS

| WO | WO 2013/164661 A1 | 11/2013 |
| WO | WO 2014/001849 A1 | 1/2014 |
| WO | WO 2016/102737 A1 | 6/2016 |
| WO | WO 2016/102738 A1 | 6/2016 |

OTHER PUBLICATIONS

Eronen, Antii; "Automatic Musical Instrument Recognition"; Master Thesis for Tampere University of Technology; Apr. 11, 2001; 74 pages.

Hess, Wolfgang and Zeller, Michael; "Loudness-Based Level Correction of Audio Entertainment Signals in Automotive Environments"; ITG-Fachbericht 236: Sprachkommunikation Sep. 26-28, 2012; 4 pages.

MPEG—Spatial Audio Object Coding [online] [retrieved Dec. 7, 2016]. Retrieved from the Internet: <URL: http://mpeg.chiariglione.org/standards/mpeg-d/spatial-audio-object-coding>. (dated Apr. 2008) 3 pages.

Rickard, Scott; "The Duet Blind Source Separation Algorithm"; Chapter 8; S. Makino et al.; Blind Speech Separation; 2007; pp. 217-241.

Starmark Incorporated, Automatic Volume Control [online] [retrieved Dec. 7, 2016]. Retrieved from the Internet: <URL: http://www.starmarktechnologies.com/Automatic-Volume-Control/index.html>. 2 pages.

Support—Logic Pro X [online] [retrieved Dec. 7, 2016]. Retrieved from the Internet: <URL: https://support.apple.com/logic-pro>. 2 pages.

* cited by examiner

METHOD AND APPARATUS FOR CONTROLLING AUDIO PLAYBACK BASED UPON THE INSTRUMENT

TECHNOLOGICAL FIELD

An example embodiment relates generally to a method, apparatus and computer program product for controlling playback of an audio file and, more particularly, for controlling playback of an audio file based upon the audio signals for a respective instrument that are dominant or loudest.

BACKGROUND

The volume at which an audio file, including those audio files associated with videos, is output may be adjusted to increase the likelihood that a listener will hear and enjoy the playback of the audio file. The volume of an audio file may be adjusted manually. However, manual adjustments generally change the volume in a uniform manner across the entire spectrum such that the volume of audio signals having frequencies in which the listener is less interested is adjusted by a proportional amount to the volume of audio signals having different frequencies in which the listener is more interested. For example, manual volume adjustments may proportionately increase both the audio signals generated by the drums in which the listener is less interested and the audio signals generated by a guitar in which the listener is more interested.

In order to reduce the requirement for input from the listener, techniques have been developed to adjust the volume at which an audio file is output based on context, such as based upon the background noise, such as based upon the spectral content of the background noise, and/or parameters of the audio file, such as the genre of the audio file. While volume adjustments based on the context may reduce manual involvement, volume adjustments based upon the context may uniformly adjust the volume for all audio signals regardless of their frequency or may only adjust the volume for audio signals within a limited frequency range that includes the dialogue of the audio file. In either instance, for an audio file that includes contributions from different instruments, the output of the audio file may still be such that the contributions of at least some of the instruments are difficult to hear, at least in noisy environments.

At least some audio files are originally mixed by a producer who determines the frequencies of audio signals to emphasize and deemphasize during different portions of the playback of the audio file. Typically, a producer mixes the audio file in a quiet environment and in accordance with the preferences of the producer. A listener, however, may have different preferences than the producer in terms of the frequencies of the audio signals to emphasize and deemphasize. Additionally, the listener may playback an audio file in a different environment than that in which the audio file was originally mixed, such as by playing back the audio file in a noisy environment. Thus, the manner in which the audio file was originally mixed may not be entirely applicable to the environment in which the audio file is played back. However, manual remixing of an audio file to differently emphasize or deemphasize frequencies of the audio signals or to otherwise adapt the audio file to the environment in which the audio file is being played back may be time consuming and may require at least some degree of experience.

In addition to or instead of adjusting the volume at which an audio file is played back, the listener may sometimes also control the level of audio dynamic compression. With respect to Dolby digital files, for example, a listener may set the level of compression with the Dolby system then maintaining dialogue from the audio file at the original level of compression, but otherwise adjusting the audio dynamic range in accordance with the level of compression established by the listener. Nonetheless, such control of the level of audio dynamic compression of an audio file again requires manual input that may be time consuming and that may require some degree of experience to achieve the desired result.

BRIEF SUMMARY

A method, apparatus and computer program product are provided in accordance with an example embodiment in order to controllably amplify or attenuate a track of an audio file that includes the audio signals attributable to a respective instrument. Thus, a listener may selectively amplify or attenuate different tracks that include the audio signals attributable to different instruments such that a listener may customize the playback of the audio file to emphasize certain instruments and deemphasize other instruments. In another example embodiment, a method, apparatus and computer program product are provided in order to adjust the volume of an audio file for which the audio signals attributable to a respective instrument are dominant or loudest based upon the manner in which the listener has previously output one or more audio files for which the audio signals attributable to the same respective instrument were dominant or loudest. Still further, a method, apparatus and computer program product are provided in accordance with an example embodiment for facilitating changes in the compression of an audio file based upon an analysis of the manner in which a user changes the volume of the audio file. As such, a method, apparatus and computer program product of these example embodiments provide for a convenient and intuitive mechanism for adjusting the manner in which an audio file is played back, thereby permitting a user to customize the playback of an audio file and to do so in a manner that is not time consuming and that does not require substantial experience.

In an example embodiment, a method is provided that includes separating an audio file into a plurality of tracks. Each track includes audio signals attributable to a different respective instrument. The method also includes determining the instrument for which the audio signals are dominant or loudest from among the tracks into which the audio file is separated and accessing settings for a volume preference of the audio signals attributable to each of the different instruments. The method further includes modifying the setting for the volume preference of the audio signals attributable to the instrument that is dominant or loudest based on user input altering a volume at which the audio file is output without modification of the setting for the volume preference of the audio signals attributable to another instrument. The method also includes amplifying or attenuating audio signals based upon the setting for the volume preference, as modified.

The method of an example embodiment modifies the setting by modifying the setting for the volume preference of the audio signals attributable to the instrument that is dominant or loudest in accordance with a direct relationship with respect to the user input. The method of another embodiment modifies the setting by modifying the setting for the volume preference of the audio signals attributable to the instrument that is dominant or loudest by a fixed amount in response to the user input. In an example embodiment, the method amplifies or attenuates the audio signals by amplifying or attenuating the audio signals representative of the instrument for which the audio signals were dominant or loudest without amplifying or attenuating the audio signals representative of the another instrument. In an embodiment in which the audio file includes a plurality of segments such that the plurality of tracks each correspondingly include a plurality of track segments, the method repeatedly determines the instrument for which the audio signals are dominant or loudest, modifies the setting for the volume preference of the audio signals attributable to the instrument that is dominant or loudest and amplifies or attenuates the audio signals of the track for the plurality of segments of the audio file.

In another example embodiment, an apparatus is provided that includes at least one processor and at least one memory including computer program code with the at least one memory and the computer program code configured to, with the at least one processor, cause the apparatus to separate an audio file into a plurality of tracks. Each track includes audio signals attributable to a different respective instrument. The at least one memory and the computer program code are also configured to, with the at least one processor, cause the apparatus to determine the instrument for which the audio signals are dominant or loudest from among the tracks into which the audio file is separated and to access settings for a volume preference of the audio signals attributable to each of the different instruments. The at least one memory and the computer program code are further configured to, with the at least one processor, cause the apparatus to modify the setting for the volume preference of the audio signals attributable to the instrument that is dominant or loudest based on user input altering a volume at which the audio file is output without modification of the setting for the volume preference of the audio signals attributable to another instrument. Additionally, the at least one memory and the computer program code are configured to, with the at least one processor, cause the apparatus to amplify or attenuate audio signals based upon the setting for the volume preference, as modified.

The at least one memory and the computer program code are configured to, with the at least one processor, cause the apparatus of an example embodiment to modify the setting by modifying the setting for the volume preference of the audio signals attributable to the instrument that is dominant or loudest in accordance with a direct relationship with respect to the user input. The at least one memory and the computer program code are configured to, with the at least one processor, cause the apparatus of another embodiment to modify the setting by modifying the setting for the volume preference of the audio signals attributable to the instrument that is dominant or loudest by a fixed amount in response to the user input. The at least one memory and the computer program code are configured to, with the at least one processor, cause the apparatus of an example embodiment to amplify or attenuate the audio signals by amplifying or attenuating the audio signals representative of the instrument for which the audio signals were dominant or loudest without amplifying or attenuating the audio signals representative of the another instrument. In an embodiment in which the audio file includes a plurality of segments such that the plurality of tracks each correspondingly include a plurality of track segments, the at least one memory and the computer program code are configured to, with the at least one processor, cause the apparatus to repeatedly determine the instrument for which the audio signals are dominant or loudest, modify the setting for volume preference of the audio signals attributable to the instrument that is dominant or loudest and amplify or attenuate the audio signals of the track for the plurality of segments of the audio file.

In a further example embodiment, a computer program product is provided that includes at least one non-transitory computer-readable storage medium having computer-executable program code portions stored therein with the computer-executable program code portions including program code instructions configured to separate an audio file into a plurality of tracks. Each track includes audio signals attributable to a different respective instrument. The computer-executable program code portions also include program code instructions configured to determine the instrument for which the audio signals are dominant or loudest from among the tracks into which the audio file is separated and program code instructions configured to access settings for a volume preference of the audio signals attributable to each of the different instruments. The computer-executable program code portions further include program code instructions configured to modify the setting for the volume preference of the audio signals attributable to the instrument that is dominant or loudest based on user input altering a volume at which the audio file is output without modification of the setting for the volume preference of the audio signals attributable to another instrument. Additionally, the computer-executable program code portions include program code instructions configured to amplify or attenuate audio signals based upon the setting for the volume preference, as modified.

In yet another example embodiment, an apparatus is provided that includes means for separating an audio file into a plurality of tracks. Each track includes audio signals attributable to a different respective instrument. The apparatus also includes means for determining the instrument for which the audio signals are dominant or loudest from among the tracks into which the audio file is separated and means for accessing settings for a volume preference of the audio signals attributable to each of the different instruments. The apparatus further includes means for modifying the setting for the volume preference of the audio signals attributable to the instrument that is dominant or loudest based on user input altering a volume at which the audio file is output without modification of the setting for the volume preference of the audio signals attributable to another instrument. The apparatus also includes means for amplifying or attenuating audio signals based upon the setting for the volume preference, as modified.

In an example embodiment, a method is provided that includes separating an audio file into a plurality of tracks. Each track includes audio signals attributable to a different respective instrument. The method also includes determining the instrument for which the audio signals are dominant or loudest from among the tracks into which the audio file is separated and determining a representation of a volume at which a user has previously output one or more audio files for which the audio signals attributable to the instrument are dominant or loudest. The method further includes adjusting a volume at which the audio file is output based upon the representation of the volume at which the user has previously output one or more audio files for which the audio signals attributable to the instrument are dominant or loudest.

The method of an example embodiment determines a representation of the volume by determining an average volume above an environment audio volume at which tracks representative of the respective instrument for which the audio signals that are dominant or loudest have been previously output. As such, the method of this embodiment may also include determining an environment audio volume. In this embodiment, the method adjusts the volume by adjusting the volume at which the audio file is output such that the track representative of the respective instrument for which the audio signals are dominant or loudest has the average volume about the environment audio volume that is determined. In this example embodiment, the method may also adjust the volume by adjusting the volume of tracks representative of instruments other than the respective instrument for which the audio signals are dominant or loudest based upon the average volume above an environment audio volume at which tracks representative of the respective instrument for which the audio signals are dominant or loudest have been previously output. The method of an example embodiment may also include updating a database to store the average volume above an environment audio volume at which tracks representative of the respective instrument for which the audio signals are dominant or loudest have been previously output.

In another example embodiment, an apparatus is provided that includes at least one processor and at least one memory including computer program code with the at least one memory and the computer program code configured to, with the at least one processor, cause the apparatus to separate an audio file into a plurality of tracks. Each track includes audio signals attributable to a different respective instrument. The at least one memory and the computer program code are also configured to, with the at least one processor, cause the apparatus to determine the instrument for which the audio signals are dominant or loudest from among the tracks into which the audio file is separated and to determine a representation of a volume at which a user has previously output one or more audio files for which the audio signals attributable to the instrument are dominant or loudest. The at least one memory and the computer program code are further configured to, with the at least one processor, cause the apparatus to adjust a volume at which the audio file is output based upon the representation of the volume at which the user has previously output one or more audio files for which the audio signals attributable to the instrument are dominant or loudest.

In a further example embodiment, a computer program product is provided that includes at least one non-transitory computer-readable storage medium having computer-executable program code portions stored therein with the computer-executable program code portions including program code instructions configured to separate an audio file into a plurality of tracks. Each track includes audio signals attributable to a different respective instrument. The computer-executable program code portions also include program code instructions configured to determine the instrument for which the audio signals are dominant or loudest from among the tracks into which the audio file is separated and program code instructions configured to determine a representation of a volume at which a user has previously output one or more audio files for which the audio signals attributable to the instrument are dominant or loudest. The computer-executable program code portions further include program code instructions configured to adjust a volume at which the audio file is output based upon the representation of the volume at which the user has previously output one or more audio files for which the audio signals attributable to the instrument are dominant or loudest.

In yet another example embodiment, an apparatus is provided that includes means for separating an audio file into a plurality of tracks. Each track includes audio signals attributable to a different respective instrument. The apparatus also includes means for determining the instrument for which the audio signals are dominant or loudest from among the tracks into which the audio file is separated and means for determining a representation of a volume at which a user has previously output one or more audio files for which the audio signals attributable to the instrument are dominant or loudest. The apparatus further includes means for adjusting a volume at which the audio file is output based upon the representation of the volume at which the user has previously output one or more audio files for which the audio signals attributable to the instrument are dominant or loudest.

In an example embodiment, a method is provided that includes determining whether a user increases volume in an instance in which an audio file is output quietly so as to satisfy a quiet threshold and decreases the volume in an instance in which the audio file is output loudly so as to satisfy a loudness threshold. The method also includes determining whether the user decreases the volume in an instance in which the audio file is output quietly and increases the volume in an instance in which the audio file is output loudly. In an instance in which the user increases the volume in an instance in which the audio file is output quietly and decreases the volume in an instance in which the audio file is output loudly, the method includes increasing compression for the audio file. Alternatively, in an instance in which the user decreases the volume in an instance in which the audio file is output quietly and increases the volume in an instance in which the audio file is output loudly, the method includes reducing compression for the audio file.

The method of an example embodiment increases and reduces compression by increasing and reducing the compression from a predefined compression. The predefined compression may be dependent upon a genre of the audio file. Additionally or alternatively, the predefined compression may be dependent upon an environment audio volume. The method of an example embodiment determines the compression of the audio file by dividing the audio file into a plurality of segments, discarding one or more segments failing to satisfy qualification criteria and determining the compression as a difference in between a loudest segment and a quietest segment of the segments remaining following the discarding. In an example embodiment, the quiet threshold is satisfied in an instance in which the audio file is output at a volume that is less than an average loudness of at least a portion of the audio file, and the loudness threshold is satisfied in an instance in which the audio file is output at a volume that is greater than the average loudness of at least a portion of the audio file.

In an example embodiment, an apparatus is provided that includes at least one processor and at least one memory including computer program code with the at least one memory and the computer program code configured to, with the at least one processor, cause the apparatus to determine whether a user increases volume in an instance in which an audio file is output quietly so as to satisfy a quiet threshold and decreases the volume in an instance in which the audio file is output loudly so as to satisfy a loudness threshold. The at least one memory and the computer program code are also configured to, with the at least one processor, cause the apparatus to determine whether the user decreases the volume in an instance in which the audio file is output quietly and increases the volume in an instance in which the audio file is output loudly. In an instance in which the user increases the volume in an instance in which the audio file is output quietly and decreases the volume in an instance in which the audio file is output loudly, the at least one memory and the computer program code are further configured to, with the at least one processor, cause the apparatus to increase compression for the audio file. Alternatively, in an instance in which the user decreases the volume in an instance in which the audio file is output quietly and increases the volume in an instance in which the audio file is output loudly, the at least one memory and the computer program code are further configured to, with the at least one processor, cause the apparatus to reduce compression for the audio file.

In a further example embodiment, a computer program product is provided that includes at least one non-transitory computer-readable storage medium having computer-executable program code portions stored therein with the computer-executable program code portions including program code instructions configured to determine whether a user increases volume in an instance in which an audio file is output quietly so as to satisfy a quiet threshold and decreases the volume in an instance in which the audio file is output loudly so as to satisfy a loudness threshold. The computer-executable program code portions also include program code instructions configured to determine whether the user decreases the volume in an instance in which the audio file is output quietly and increases the volume in an instance in which the audio file is output loudly. In an instance in which the user increases the volume in an instance in which the audio file is output quietly and decreases the volume in an instance in which the audio file is output loudly, the computer-executable program code portions further include program code instructions configured to increase compression for the audio file. Alternatively, in an instance in which the user decreases the volume in an instance in which the audio file is output quietly and increases the volume in an instance in which the audio file is output loudly, the computer-executable program code portions further include program code instructions configured to reduce compression for the audio file.

In yet another example embodiment, an apparatus is provided that includes means for determining whether a user increases volume in an instance in which an audio file is output quietly so as to satisfy a quiet threshold and decreases the volume in an instance in which the audio file is output loudly so as to satisfy a loudness threshold. The apparatus also includes means for determining whether the user decreases the volume in an instance in which the audio file is output quietly and increases the volume in an instance in which the audio file is output loudly. In an instance in which the user increases the volume in an instance in which the audio file is output quietly and decreases the volume in an instance in which the audio file is output loudly, the apparatus includes means for increasing compression for the audio file. Alternatively, in an instance in which the user decreases the volume in an instance in which the audio file is output quietly and increases the volume in an instance in which the audio file is output loudly, the apparatus includes means for reducing compression for the audio file.

BRIEF DESCRIPTION OF THE DRAWINGS

Figure 1:
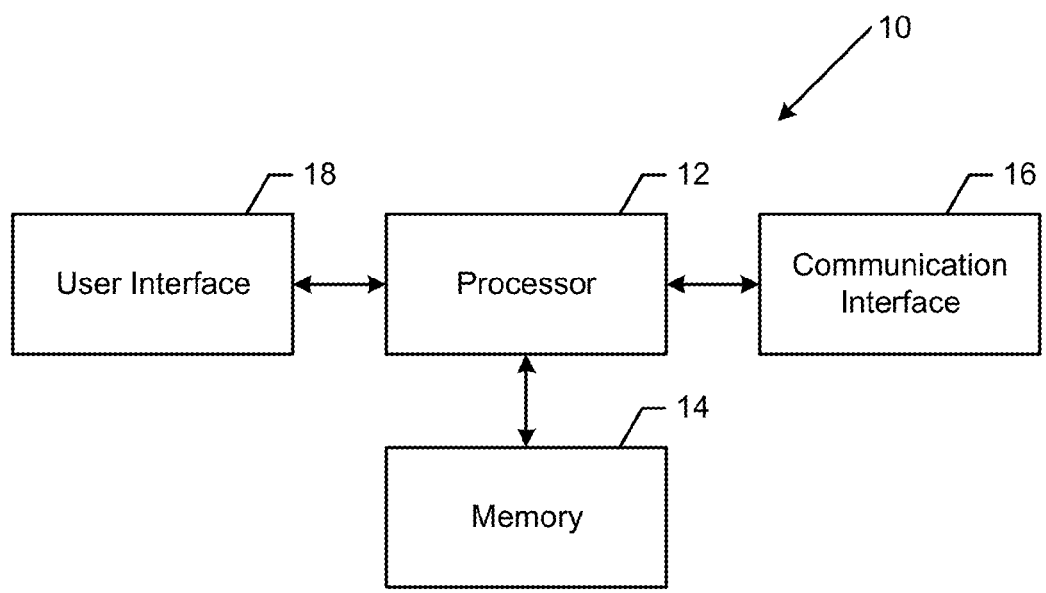
Figure 2:
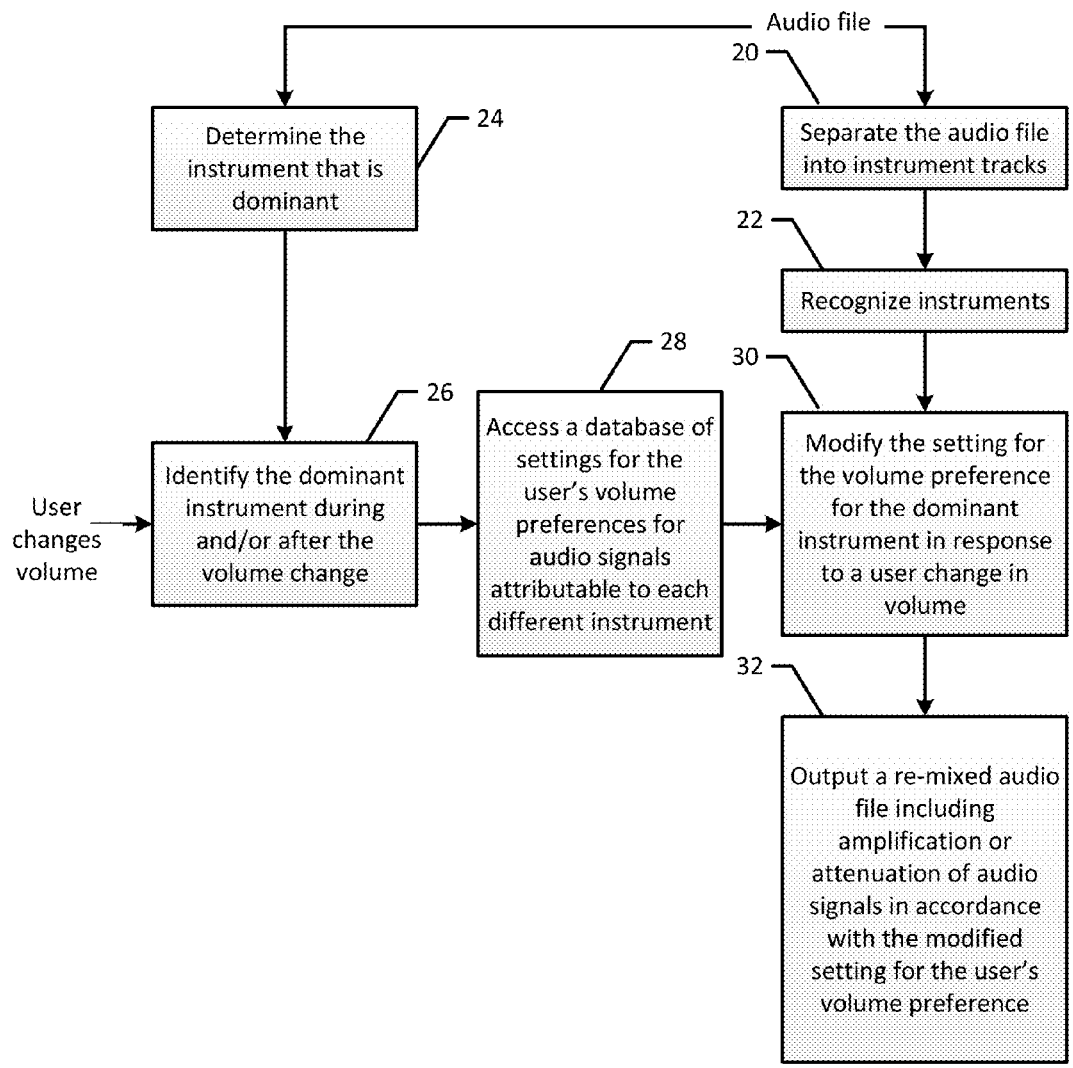
Figure 3:
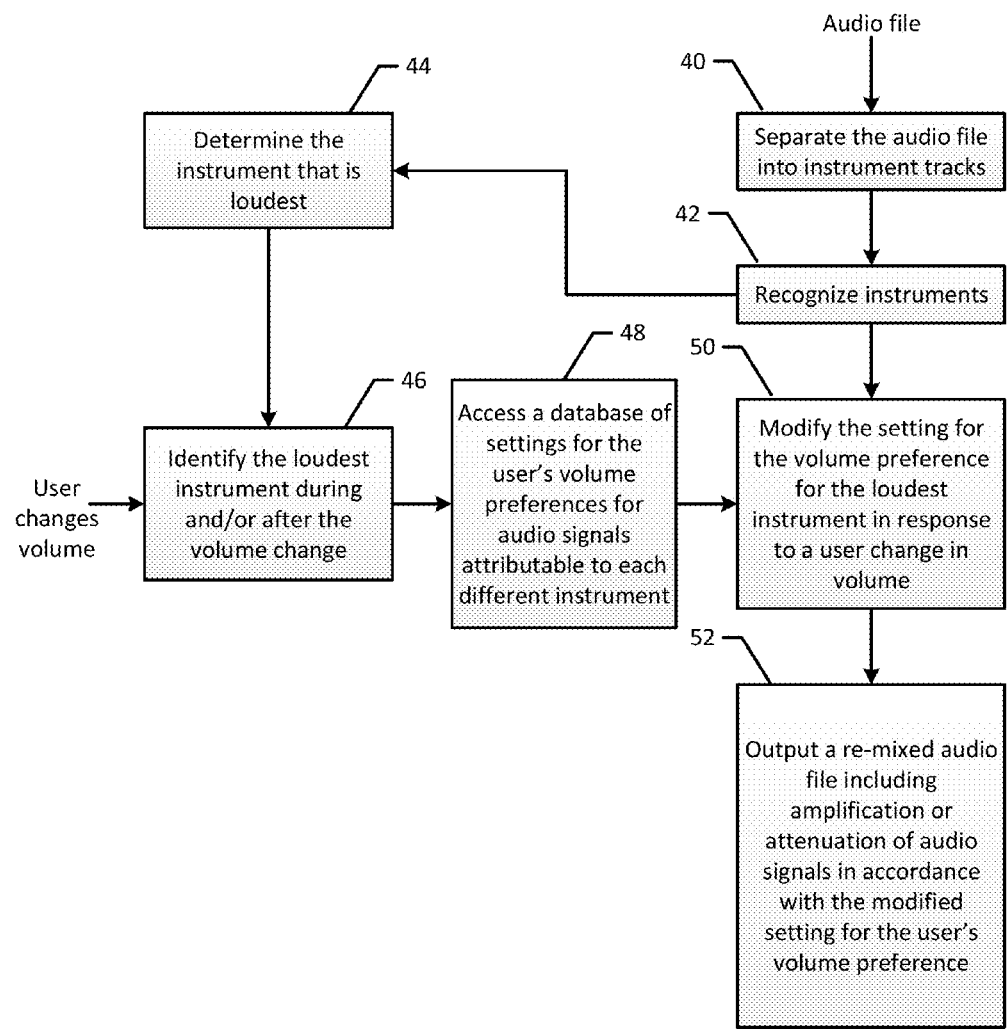
Figure 4:
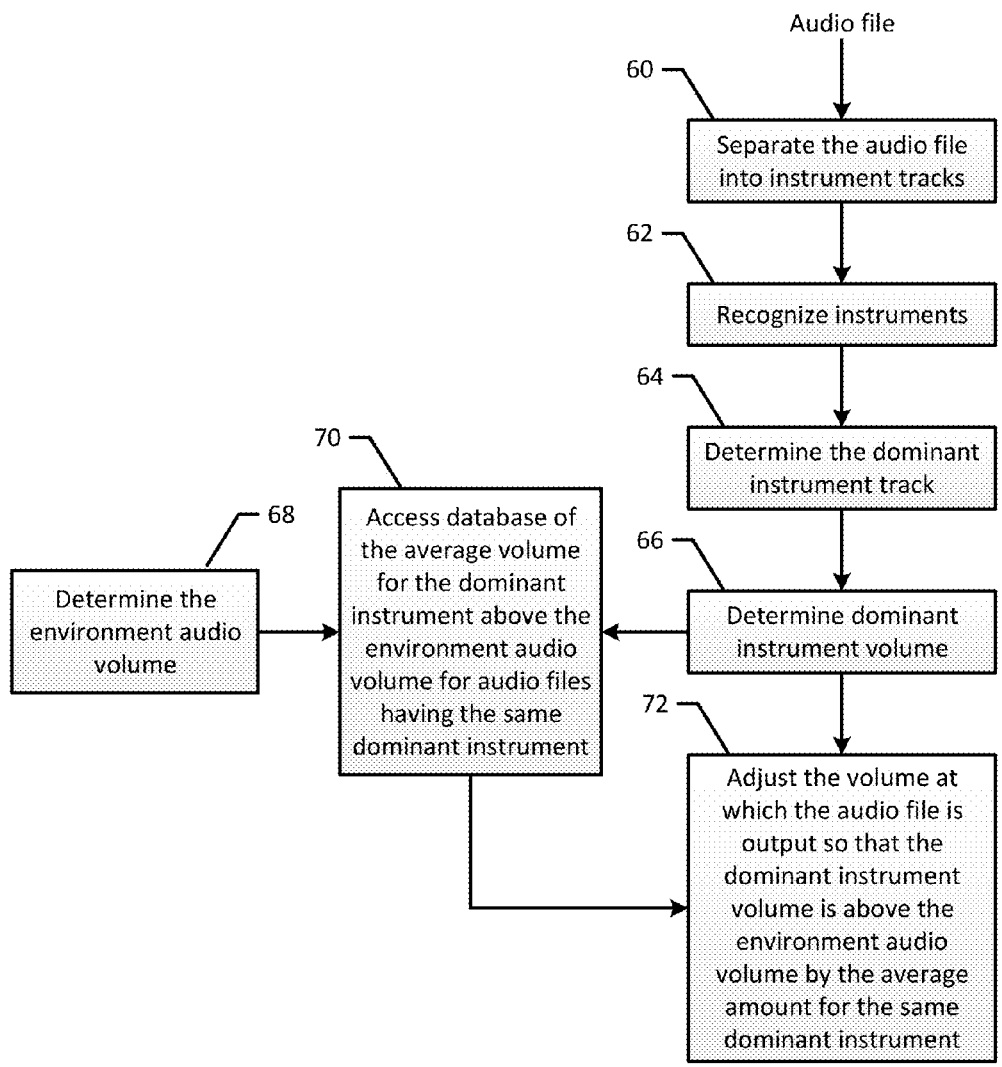
Figure 5:
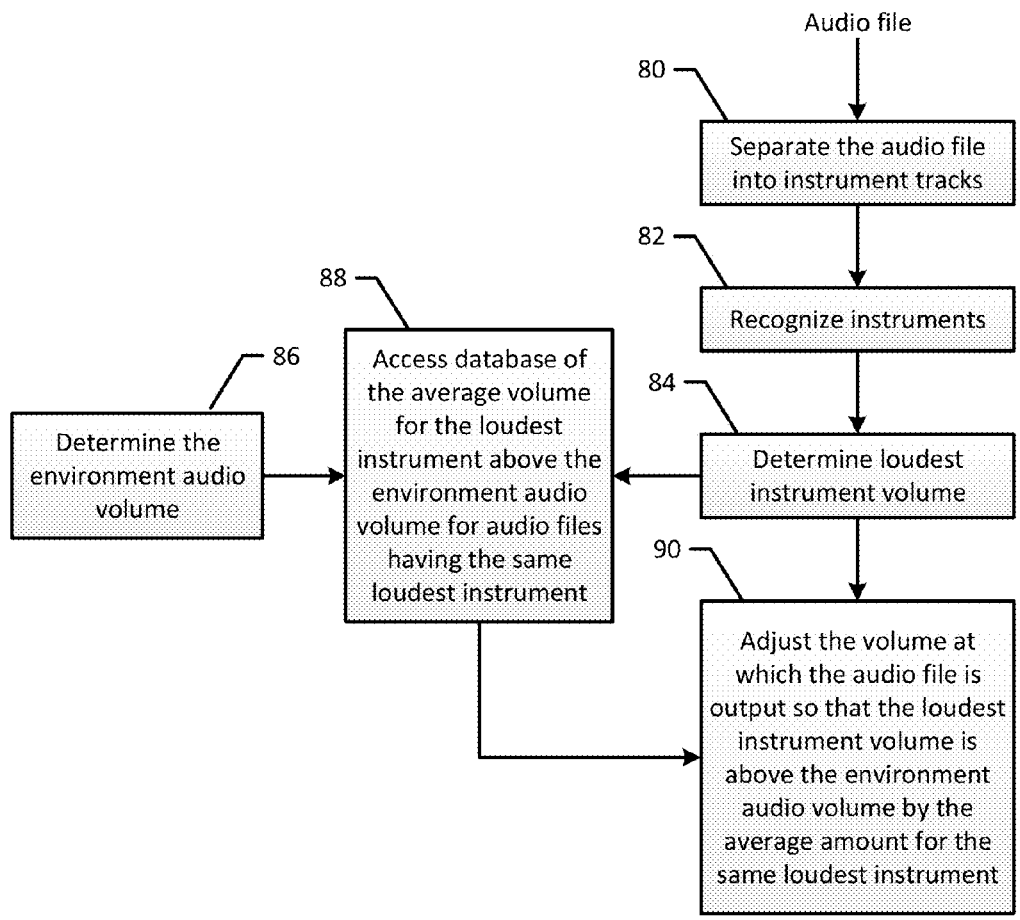
Figure 6:
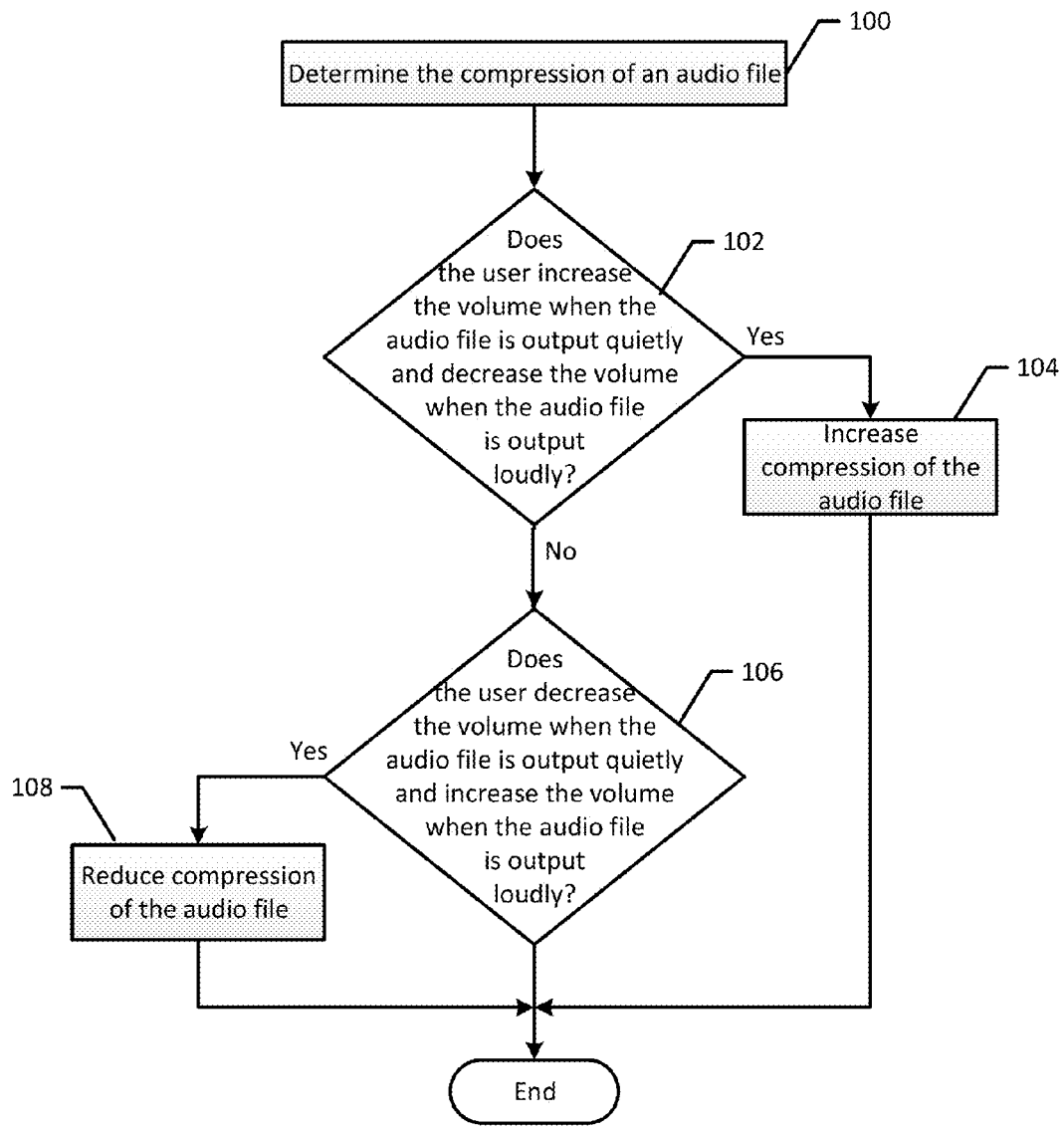

Having thus described certain example embodiments of the present disclosure in general terms, reference will hereinafter be made to the accompanying drawings, which are not necessarily drawn to scale, and wherein:

FIG. 1 is a block diagram of an apparatus specifically configured in accordance with an example embodiment of the present invention;

FIG. 2 is a flow chart illustrating operations performed, such as by the apparatus of FIG. 1, in accordance with an example embodiment of the present invention;

FIG. 3 is a flow chart illustrating operations performed, such as by the apparatus of FIG. 1, in accordance with an alternative embodiment of the present invention;

FIG. 4 is a flow chart illustrating operations performed, such as by the apparatus of FIG. 1, in accordance with another example embodiment of the present invention;

FIG. 5 is a flow chart illustrating operations performed, such as by the apparatus of FIG. 1, in accordance with an alternative embodiment of the present invention; and FIG. 6 is a flow chart illustrating operations performed, such as by the apparatus of FIG. 1, in accordance with a further embodiment of the present invention.

DETAILED DESCRIPTION

Some embodiments will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "data," "content," "information," and similar terms may be used interchangeably to refer to data capable of being transmitted, received and/or stored in accordance with embodiments of the present invention. Thus, use of any such terms should not be taken to limit the spirit and scope of embodiments of the present invention.

Additionally, as used herein, the term 'circuitry' refers to (a) hardware-only circuit implementations (e.g., implementations in analog circuitry and/or digital circuitry); (b) combinations of circuits and computer program product(s) comprising software and/or firmware instructions stored on one or more computer readable memories that work together to cause an apparatus to perform one or more functions described herein; and (c) circuits, such as, for example, a microprocessor(s) or a portion of a microprocessor(s), that require software or firmware for operation even if the software or firmware is not physically present. This definition of 'circuitry' applies to all uses of this term herein, including in any claims. As a further example, as used herein, the term 'circuitry' also includes an implementation comprising one or more processors and/or portion(s) thereof and accompanying software and/or firmware. As another example, the term 'circuitry' as used herein also includes, for example, a baseband integrated circuit or applications processor integrated circuit for a mobile phone or a similar integrated circuit in a server, a cellular network device, other network device, and/or other computing device.

As defined herein, a "computer-readable storage medium," which refers to a non-transitory physical storage medium (e.g., volatile or non-volatile memory device), can be differentiated from a "computer-readable transmission medium," which refers to an electromagnetic signal.

A method, apparatus and computer program product are provided in accordance with an example embodiment in order to permit a user, such as a listener, to controllably adjust the manner in which an audio file is played back. For example, the method, apparatus and computer program product of an example embodiment may provide for the controllable adjustment of the volume of a track of the audio file representative of the instrument for which the audio signals are dominant or loudest. As such, the user may adjust the volume to controllably emphasize or deemphasize the instrument for which the audio signals are dominant or loudest pursuant to the user's preferences. In another example embodiment, a method, apparatus and computer program product are provided in order to adjust the volume at which an audio file is output based upon the manner in which the user has previously caused audio files that have the same dominant or loudest instrument to be output. Thus, the method, apparatus and computer program product of this example embodiment learns from past behavior of the user in conjunction with audio files that have the same dominant or loudest instrument in order to tailor the volume at which an audio file is output. In a further embodiment, a method, apparatus and computer program product provide for the controlled compression of an audio file depending upon the manner in which the user changes the volume of the audio file being played back. Thus, the method, apparatus and computer program product of this example embodiment may convert specific volume adjustments to a more general compression of an audio file. As such, methods, apparatuses and computer program products of example embodiments permit a user to customize the playback of an audio file in the manner that is consistent with the user preferences and in the manner that is relatively intuitive without being time consuming.

As noted above, an apparatus is provided in order to controllably adjust the manner in which an audio file is played back. The apparatus may be configured in various manners. For example, the apparatus may be embodied by a computing device of or otherwise associated with an audio/video player, an audio/video receiver, an audio/video recording device, an audio/video mixing device or a radio. However, the apparatus may, instead, be embodied by or associated with any of a variety of other computing devices, including, for example, a mobile terminal, such as a portable digital assistant (PDA), mobile telephone, smartphone, pager, mobile television, gaming device, laptop computer, camera, tablet computer, touch surface, video recorder, radio, electronic book, positioning device (e.g., global positioning system (GPS) device), or any combination of the aforementioned, and other types of voice and text communications systems. Alternatively, the computing device may be a fixed computing device, such as a personal computer, a computer workstation, a server or the like. While the apparatus may be embodied by a single computing device, the apparatus of some example embodiments may be embodied in a distributed manner with some components of the apparatus embodied by a first computing device, such as an audio/video player, and other components of the apparatus embodied by a computing device that is separate from, but in communication with, the first computing device, such as the audio/video player. Additionally or alternatively, the apparatus may be implemented in conjunction with software players, such as Winamp and Windows Media Player, and/or music services, such as Spotify and iTunes.

Regardless of the manner in which the apparatus is embodied, the apparatus 10 of an example embodiment depicted in FIG. 1 is configured to include or otherwise be in communication with a processor 12, a memory device 14 and a user interface 16 and optionally a communication interface 18. In some embodiments, the processor (and/or co-processors or any other processing circuitry assisting or otherwise associated with the processor) may be in communication with the memory device via a bus for passing information among components of the apparatus. The memory device may be non-transitory and may include, for example, one or more volatile and/or non-volatile memories. In other words, for example, the memory device may be an electronic storage device (e.g., a computer readable storage medium) comprising gates configured to store data (e.g., bits) that may be retrievable by a machine (e.g., a computing device like the processor). The memory device may be configured to store information, data, content, applications, instructions, or the like for enabling the apparatus to carry out various functions in accordance with an example embodiment of the present invention. For example, the memory device could be configured to buffer input data for processing by the processor. Additionally or alternatively, the memory device could be configured to store instructions for execution by the processor.

As described above, the apparatus 10 may be embodied by a computing device. However, in some embodiments, the apparatus may be embodied as a chip or chip set. In other words, the apparatus may comprise one or more physical packages (e.g., chips) including materials, components and/or wires on a structural assembly (e.g., a baseboard). The structural assembly may provide physical strength, conservation of size, and/or limitation of electrical interaction for component circuitry included thereon. The apparatus may therefore, in some cases, be configured to implement an embodiment of the present invention on a single chip or as a single "system on a chip." As such, in some cases, a chip or chipset may constitute means for performing one or more operations for providing the functionalities described herein.

The processor 12 may be embodied in a number of different ways. For example, the processor may be embodied as one or more of various hardware processing means such as a coprocessor, a microprocessor, a controller, a digital signal processor (DSP), a processing element with or without an accompanying DSP, or various other processing circuitry including integrated circuits such as, for example, an ASIC (application specific integrated circuit), an FPGA (field programmable gate array), a microcontroller unit (MCU), a hardware accelerator, a special-purpose computer chip, or the like. As such, in some embodiments, the processor may include one or more processing cores configured to perform independently. A multi-core processor may enable multiprocessing within a single physical package. Additionally or alternatively, the processor may include one or more processors configured in tandem via the bus to enable independent execution of instructions, pipelining and/or multithreading.

In an example embodiment, the processor 12 may be configured to execute instructions stored in the memory device 14 or otherwise accessible to the processor. Alternatively or additionally, the processor may be configured to execute hard coded functionality. As such, whether configured by hardware or software methods, or by a combination thereof, the processor may represent an entity (e.g., physically embodied in circuitry) capable of performing operations according to an embodiment of the present invention while configured accordingly. Thus, for example, when the processor is embodied as an ASIC, FPGA or the like, the processor may be specifically configured hardware for conducting the operations described herein. Alternatively, as another example, when the processor is embodied as an executor of software instructions, the instructions may specifically configure the processor to perform the algorithms and/or operations described herein when the instructions are executed. However, in some cases, the processor may be a processor of a specific device (e.g., an audio/video player, an audio/video mixer, a radio or a mobile terminal) configured to employ an embodiment of the present invention by further configuration of the processor by instructions for performing the algorithms and/or operations described herein. The processor may include, among other things, a clock, an arithmetic logic unit (ALU) and logic gates configured to support operation of the processor.

In some embodiments, the apparatus 10 may include a user interface 16 that may, in turn, be in communication with the processor 12 to provide output to the user and to receive an indication of a user input. As such, the user interface may include a display and, in some embodiments, may also include a keyboard, a mouse, a joystick, a touch screen, touch areas, soft keys, a microphone, a speaker, or other input/output mechanisms. Alternatively or additionally, the processor may comprise user interface circuitry configured to control at least some functions of one or more user interface elements such as a display and, in some embodiments, a speaker, ringer, microphone and/or the like. The processor and/or user interface circuitry comprising the processor may be configured to control one or more functions of one or more user interface elements through computer program instructions (e.g., software and/or firmware) stored on a memory accessible to the processor (e.g., memory device 14, and/or the like).

The apparatus 10 may optionally also include the communication interface 18. The communication interface may be any means such as a device or circuitry embodied in either hardware or a combination of hardware and software that is configured to receive and/or transmit data from/to a network and/or any other device or module in communication with the apparatus. In this regard, the communication interface may include, for example, an antenna (or multiple antennas) and supporting hardware and/or software for enabling communications with a wireless communication network. Additionally or alternatively, the communication interface may include the circuitry for interacting with the antenna(s) to cause transmission of signals via the antenna(s) or to handle receipt of signals received via the antenna(s). In some environments, the communication interface may alternatively or also support wired communication. As such, for example, the communication interface may include a communication modem and/or other hardware/software for supporting communication via cable, digital subscriber line (DSL), universal serial bus (USB) or other mechanisms.

In an example embodiment, the apparatus 10 is configured to provide for the amplification or attenuation of a track of an audio file with the track being representative of the instrument for which the audio signals are dominant or loudest. Thus, a user may preferentially amplify or attenuate the track representative of the dominant or loudest instrument without correspondingly amplifying or attenuating the other tracks representative of other instruments that are not dominant or loudest. The user may therefore selectively emphasize or deemphasize the instrument for which the audio signals are dominant or loudest depending upon, for example, their preferences. Although described herein with respect the amplification or attenuation of a track of an audio file, reference to amplification or attenuation is provided by way of example and other parameters of an audio file may be comparably modified such as panning, e.g., panning input from a user who commonly pans the audio output to the right when a guitar is dominant may cause audio output to be automatically panned to the right when the guitar is dominant, or equalization, e.g., a equalization input by a user who frequently utilized an equalization button to amplify bass during rock songs may cause rock songs to be automatically equalized so as to have more bass.

Referring now to FIG. 2, the operations performed by the apparatus 10 of FIG. 1 in accordance with this example embodiment of the present invention are depicted. As shown in block 20, the apparatus of an example embodiment includes means, such as the processor 12 or the like, for separating an audio file into a plurality of tracks. The audio file may be an audio file that is separate from any video file, or the audio file may be the audio file of a video that includes both a video file and an audio file. In either instance, the audio file is separated into a plurality of tracks with each track including the audio signals attributable to a different respective instrument. For example, a first track may include the audio signals attributable to a guitar, a second track may include the audio signals attributable the drums, a third audio track may include the audio signals attributable to a synthesizer, and a fourth audio track may include the audio signals attributable to the vocals. Although the following examples will include tracks with a single instrument, some tracks may include multiple instruments, such as multiple instruments of the same type, e.g., a plurality of different types of drums. Also, although instruments are generally referenced herein in terms of instruments that are played, reference to instruments also includes vocal, e.g., a voice instrument, with vocal instruments being distinguished based upon differences between the speech and song, and between male and female vocalists, to name but a few distinctions. In some example embodiments, the vocals may be controlled so that female singer(s) are emphasized over male singer(s), or vice versa, by amplification or attenuation.

The apparatus 10, such as the processor 12, may be configured to separate the audio file into the plurality of tracks in various manners. In an example embodiment, however, an audio file is separated into different tracks utilizing the Degenerate Unmixing Estimation Technique (DUET) blind source separation algorithm as described by Chapter 8 authored by Scott Rickard of Blind Speech Separation (2007). Alternatively, in an instance in which the audio file has a Moving Picture Experts Group (MPEG) Spatial Audio Object Coding (SAOC) format or a Dolby Atmos format, the apparatus, such as the processor, may be configured to readily separate the audio file into a plurality of tracks since audio files having an MPEG SAOC format have partially separated tracks and since audio files having a Dolby Atmos format have completely separated tracks.

Once the tracks are separated, the apparatus 10 includes means, such as the processor 12 or the like, for recognizing the instrument associated with each different track of the audio file. See block 22. The apparatus, such as the processor, may recognize the instrument associated with each different track of the audio file in various manners including, for example, as described by Antii Eronen in a master's thesis for Tampere University of Technology entitled "Automatic Musical Instrument Recognition". Alternatively, the apparatus, such as the processor, may determine the instrument associated with each different track of the audio file based upon metadata associated with the audio file, such as may be provided in instances in which the audio file has an MPEG SAOC format or a Dolby Atmos format.

As shown in block 24 of FIG. 2, the apparatus 10 of this example embodiment also includes means, such as the processor 12 or the like, for determining the instrument for which the audio signals of the audio file are dominant. In this regard, the apparatus, such as the processor, determines the instrument for which the audio signals are dominant from among the instruments associated with the tracks into which the audio file is separated. The apparatus, such as the processor, may determine the instrument for which the audio signals are dominant in various manners including, for example, as described by UK Patent Application No. GB 2533654 to Eronen, et al., the contents of which are incorporated herein in its entirety. For example, the guitar may be the instrument for which the audio signals are dominant or, alternatively, the drums may be the instrument for which the audio signals are dominant. A dominant instrument may be defined in terms of the relative loudness of an instrument with instruments having greater loudness also being considered more dominant. However, the use of an instrument during a key moment of a song, such as during the beginning or end of a song and/or during the chorus of a song, may also identify an instrument as being dominant, either in combination with the loudness or instead of the loudness. As the instrument for which the audio signals are dominant may change from time to time during the playback of the audio file, such as over the duration of a song for which the guitar is the instrument for which the audio signals are dominant for one portion of the song and the drums are the instrument for which the audio signals are dominant for another portion of the song, the audio file may be divided into segments with each segment separately analyzed in order to determine the instrument for which the audio signals are dominant in accordance with some example embodiments as described below.

During the playback of the audio file in which the audio signals that comprise the audio file are output, such as by the user interface 16, e.g., speakers, headphones or other audio output mechanisms, the user may change the volume at which the audio file is output, such as by increasing the volume or decreasing the volume via input provided, for example, by the user interface. As such, the apparatus 10 of this example embodiment includes means, such as the processor 12, for identifying the instrument for which the audio signals are dominant during and/or after the change in the volume at which the audio file is output. See block 26 of FIG. 2. In this regard, the instrument for which the audio signals are dominant at the time that the user changes the volume may be the instrument previously determined to be dominant in block 24.

As shown in block 28 of FIG. 2, the apparatus 10 also includes means, such as the processor 12, the memory 14 or the like, for accessing a database of settings for the user's volume preferences for audio signals attributable to each different instrument. The database may be stored by the memory or by an external database, memory device, cloud storage or the like, that is accessible by the apparatus, such as the processor, via the communication interface 18. The database may define the current settings for the volume preferences for the audio signals attributable to each different instrument. The settings for the volume preferences may be defined in different manners, such as in terms of decibels by which the track associated with a respective instrument is amplified or attenuated. Although the volume preferences for the audio signals attributable to each different instrument may be differently defined, one example of the settings attributable to each different instrument is vocals 0 dB, guitar 5 dB, drums −3 dB, and synthesizer 1 dB. In this example, the playback of the audio file would result in the vocal track not being amplified, the guitar track being amplified by 5 dB, the drum track being attenuated by 3 dB and the synthesizer track being amplified by 1 dB.

In accordance with an example embodiment, in response to user input changing the volume, the apparatus 10, such as the processor 12, may, but need not necessarily, change the volume at which all of the audio signals of the audio file are output in a manner consistent with the user input. However, the apparatus of this example embodiment includes means, such as the processor, for modifying the setting maintained by the database for the volume preference for the audio signals attributable to the instrument that is dominant during and/or after the user has provided input to change the volume. See block 30 of FIG. 2. Thus, in an instance in which a user changes the volume while the guitar is the instrument for which the audio signals are dominant, the settings for the volume preference for the guitar may be correspondingly changed based upon the user input, but the volume settings maintained by the database for the other instruments are not changed. In an example embodiment, the modification of the setting maintained by the database for the volume preference for the audio signals attributable to the instrument that is dominant may also cause the setting maintained by the database for the volume preference for the audio signals attributable to other similar instruments, that is, other instruments of the same type, e.g., string instruments, brass instruments, etc. to be correspondingly modified, while the volume settings maintained by the database for the other instruments are not changed. For example, modification of the settings for the volume preference for the guitar may also cause modification of the settings for the volume preference for other plucked string instruments, such as mandolins, sitars, balalaikas, etc.

In an example embodiment, the apparatus 10, such as the processor 12, modifies the setting for the volume preference for the audio signals attributable to the instrument that is dominant in accordance with a direct relationship to the user input. Thus, in an instance in which the user increases the volume, the apparatus, such as the processor, correspondingly increases the volume preference for the audio signals attributable to the instrument for which the audio signals are dominant at the time at which the user increases the volume. Alternatively, in an instance in which the user decreases the volume, the apparatus, such as the processor, correspondingly decreases the volume preference for the audio signals attributable to the instrument for which the audio signals are dominant at the time at which the user decreases the volume.

In addition, the apparatus 10, such as the processor 12, may be configured to modify the setting for the volume preference of the audio signals attributable to the instrument that is dominant at the time at which the user alters the volume by an extent or magnitude that is equal to or otherwise in correspondence with, e.g., proportional to, the amount that the user adjusts the volume at which the audio file is output. In this example embodiment, greater changes in the volume cause greater modifications in the setting for the volume preference for the audio signals attributable to the instrument that is dominant than do smaller changes in the volume.

As an alternative to modifications that are equal to or in correspondence with the amount of the volume adjustment, the apparatus 10, such as the processor 12, of an example embodiment is configured to modify the setting for the volume preference for the audio signals attributable to the instrument that is dominant by a fixed amount that increases or decreases the volume preference in response to the user input increasing or decreasing the volume, respectively. Thus, in an instance in which the user adjusts the volume at which the audio file is output, the setting for the volume preference for the audio signals attributable to the instrument that is dominant may be modified by a fixed amount regardless of the amount of the change in the volume provided by the user. For example, in an instance in which the user increases the volume, either by a large amount or a small amount, the setting for the volume preference for the audio signals attributable to the instrument that is dominant may be increased by a fixed amount, such as 1 dB. Conversely, in an instance in which in an instance in which the user decreases the volume, either by a large amount or a small amount, the setting for the volume preference for the audio signals attributable to the instrument that is dominant may be decreased by the same fixed amount, such as 1 dB.

In an example embodiment, the maximum amount by which the setting for the volume preference may be modified relative to the initial setting for the volume preference for the audio signals attributable to the instrument that is dominant may be limited, such as to a predefined limit, e.g., +/−5 dB. As such, further changes of the same type (e.g., further increases or further decreases) in the volume at which the audio file is to be output will not cause the volume preference to change once the apparatus 10, such as the processor 12, has modified this setting for the volume preference for the instrument for which the audio signals are dominant by an amount equal to the predefined limit as a result of prior changes in the volume at which the audio file is to be output by the user.

In response to the user input changing the volume, the volume at which the entire audio file is output may, but need not necessarily, be changed with any changes in volume brought about directly from the user input changing the volume being applied consistently and uniformly for each of the tracks of the audio file. However, changes in the volume at which an audio file is output that occur indirectly as a result of the volume preferences are not applied uniformly for each of the tracks of the audio file, but, instead, the volume at which the different tracks of the audio file are output changes differently for the different tracks in response to the changes in volume preferences brought about by the user input changing the volume. In this regard and as noted above, the apparatus 10, such as the processor 12, is configured to modify the setting for the volume preference for the audio signals attributable to the instrument that is dominant based on user input altering the volume at which the audio file is output without modification of the setting for the volume preference for the audio signals attributable to other, non-dominant instruments. Consequently, the apparatus of this example embodiment also includes means, such as the processor, the user interface 18 or the like, for outputting a re-mix of the audio file by causing the audio signals to be amplified or attenuated in accordance with the volume preference, as now modified. In an example embodiment, the apparatus, such as the processor, is configured to amplify or attenuate the audio signals representative of the instrument for which the audio signals were dominant without amplifying or attenuating the audio signals representative of the other instruments for which the audio signals are not dominant based upon the respective volume preferences since the volume preferences for the other instruments were not changed in response to the user input that changed the volume. See block 32 of FIG. 2. Although the audio signals that are to be amplified or attenuated were dominant in the track that was analyzed in response to the user input, the audio signals need not necessarily continue to be dominant in the audio file at the time at which they are amplified or attenuated in accordance with the volume preference, as now modified.

By way of example, the initial volume preferences may be 0 dB for vocals, 5 dB for guitar, −3 dB for drums, and 1 dB for the synthesizer. In response to user input increasing the volume while the audio signals for the guitar are dominant, the volume preference for guitar may be increased by a fixed 1 dB amount to 6 dB, while the volume preferences for the other instruments remain the same. As such, the subsequent playback of the audio file would result in the overall volume being increased based upon the user input with the vocal track not being amplified beyond the overall volume increase, the guitar track being amplified by 6 dB relative to volume defined by the user input, the drum track being attenuated by 3 dB relative to volume defined by the user input and the synthesizer track being amplified by 1 dB relative to volume defined by the user input. Thus, the user input has caused the audio signals attributable to the dominant instrument, that is, the guitar, to be further emphasized (from amplification of 5 dB to 6 dB) relative to the audio signals attributable to the other instruments for which the volume preferences were not changed in response to the user input.

As described above in conjunction with FIG. 2, the audio file may be separated into tracks that are attributable to different instruments and the setting for the volume preference for the audio signals attributable to the instrument that is dominant may be modified based upon user input changing the volume at which the audio file is to be output. However, the apparatus 10, such as the processor 12, of another embodiment may consider, not the instrument for which the audio signals are dominant, but, instead, the instrument for which the audio signals are loudest at the time or following the time at which the volume is changed based upon the user input. In this regard and as shown in FIG. 3, after having separated the audio file into a plurality of tracks that each include audio signals attributable to a different respective instrument and recognizing the instruments associated with each track, such as in the manner described above with respect to blocks 20 and 22 of FIG. 2, the apparatus includes means, such as the processor or the like, for determining the instrument for which the audio signals are loudest from among the tracks into which the audio file is separated. See blocks 40, 42 and 44 of FIG. 3. The apparatus, such as the processor, may be configured to determine the instrument for which the audio signals are loudest in various manners including, for example, based upon the loudness of the separated tracks.

In response to a change in volume by the user, the apparatus 10 of this example embodiment includes means, such as the processor 12 or the like, for identifying the loudest instrument during and/or after the change in the volume, such as based upon the determination described above with respect to block 44. See block 46. After having accessed the database of settings for the user's volume preferences for audio signals attributable to each different instrument as described above with respect to block 28 and as shown in block 48 of FIG. 3, the apparatus of this example embodiment also includes means, such as the processor or the like, for modifying the settings for the volume preference for the loudest instrument in response to a user change in volume prior to outputting the remixed audio file. See block 50 of FIG. 3. In this regard, after having modified the setting for the user's volume preference for the dominant instrument in response to a user change in volume, the apparatus of this example embodiment includes means, such as the processor, the user interface 18 or the like, for outputting a re-mixed audio file by causing the audio signals to be amplified or attenuated in accordance with the volume preference, as now modified. In an example embodiment, the apparatus, such as the processor, is configured to amplify or attenuate the audio signals representative of the instrument for which the audio signals were loudest without amplifying or attenuating the audio signals representative of the other instruments for which the audio signals are not the loudest based upon the respective volume preferences since the volume preferences for the other instruments were not changed in response to the user input that changed the volume. See block 52.

As mentioned above, the audio file of at least some example embodiments includes a plurality of segments such that the plurality of tracks each correspondingly include a plurality of track segments. In this regard, the segments may include a portion of the audio file or a track of the audio file for a limited period of time, such as one second, five seconds, ten seconds, or the like, with the combination of segments making up the entire audio file. In an embodiment in which the audio file includes a plurality of segments, the apparatus 10, such as the processor 12, of an example embodiment is configured to determine the instrument for which the audio signals are dominant or loudest for a respective segment and to then modify the setting for the volume preference of the audio signals attributable to the instrument that is dominant or loudest prior to amplifying or attenuating the volume of the track representative of the instrument for which the audio signals are dominant or loudest for the respective segment of the audio file. In accordance with this example embodiment, the foregoing process may be repeated for each segment of the audio file with the instrument for which the audio signals are dominant or loudest potentially varying from one segment to another of the same audio file. Although described herein with respect to dominance or loudness, the apparatus may, instead, modify the audio signals based upon the instrument that is least loud or that satisfies another identifiable characteristic at the time of the user input.

In another example embodiment, the volume at which the entire audio file is output is adjusted based upon user input while maintaining the instrument for which the audio signals are dominant or loudest at a volume above the environment audio volume by an amount that takes into account user input that changes the volume of the audio file. As shown in FIG. 4, for example, the apparatus 10 of this example embodiment again includes means, such as the processor 12 or the like, for separating the audio file into a plurality of tracks with each track including audio signals attributable to a different respective instrument. See block 60. The apparatus of this example embodiment also includes means, such as the processor or the like, for recognizing the different instruments associated with each track into which the audio file has been separated. See block 62. Further, the apparatus of the example embodiment of FIG. 4 includes means, such as the processor or the like, for determining the instrument for which the audio signals are dominant from among the tracks into which the audio file is separated and means, such as the processor or the like, for determining the volume of the track associated with the instrument for which the audio signals are dominant. See blocks 64 and 66.

The apparatus 10 of this example embodiment also includes means, such as the processor 12 or the like, for determining a representation of the volume at which the user has previously output one or more audio files for which the audio signals attributable to the same instrument are dominant, that is, the same instrument for which the audio signals are dominant in the audio file that is currently being processed. In this regard, the apparatus, such as the processor, of one example embodiment may determine the average volume at which the user has previously output the same audio file, since the same audio file would necessarily include audio signals attributable to the same instrument that are dominant. In the other embodiments, the apparatus, such as the processor, determines the average volume at which the user has previously output one or more other audio files in the past with the one or more audio files having audio signals attributable to the same instrument that are dominant. Although the apparatus, such as the processor may determine the representation of the volume at which the user has previously output one or more audio files for which the audio signals attributable to the same instrument are dominant in various manners, the apparatus of an example embodiment may be configured to access a database, such as maintained by the memory 14, which stores information regarding the volume at which the user has previously output one or more audio files for which the audio signals attributable to the same instrument are dominant. Thus, in an example embodiment in which the audio file that is currently being processed includes audio signals attributable to a guitar that are dominant, the apparatus, such as the processor, is configured to determine the average volume at which the user previously output the same and/or other audio files for which the audio signals attributable to a guitar were dominant.

The apparatus 10 of this example embodiment also includes means, such as the processor 12 or the like, for adjusting the volume at which the audio file is output based upon the representation of the volume, such as the average volume, at which the user has previously output one or more audio files for which the audio signals attributable to the instrument are dominant. Thus, the apparatus, such as the processor, is configured to adjust the volume at which the audio file in its entirety is output such that the volume of the audio signals attributable to the instrument that is dominant are output at the same volume at which the audio signals attributable to the instrument that is dominant have been output in the past in conjunction with the output of one or more audio files for which the same instrument is dominant. Consequently, the apparatus, such as the processor, maintains the volume of the audio signals attributable to the instrument that is dominant at the level that has been historically desired by the user.

In addition to adjusting the volume at which the audio file is output, the apparatus 10 of an example embodiment also includes means, such as the processor 12, the memory 14 or the like, for updating the database that maintains the representation of the volume, such as the average volume, at which the user has previously output one or more audio files for which the audio signals attributable to the instrument are dominant in response to user input changing the volume at which the audio file is output. As such, the database maintains an updated representation of the volume, such as an updated average of the volume, at which the user has output audio file(s) for which the audio signals attributable to the same instrument have been dominant.

Although the environment audio volume need not be taken into account, the apparatus 10 of an example embodiment determines the representation of the volume at which the user has previously output one or more audio files for which the audio signals attributable to the same instrument are dominant by including means, such as the processor 12 or the like, for determining an average volume above an environment audio volume at which tracks representative of the respective instrument for which the audio signals are dominant have been previously output. In this regard and as shown in block 68 of FIG. 4, the apparatus may include means, such as a sensor, e.g., a microphone, or may be in communication with a sensor, such as a microphone, for determining the environment audio volume. The apparatus of this example embodiment also includes means, such as the processor, the memory 14 or the like, for accessing a database that stores the representation of the volume, such as the average volume, above the environment audio volume at which the user has previously output one or more audio files for which the audio signals attributable to the same instrument are dominant. See block 70 of FIG. 4. In this example embodiment, the apparatus, such as the processor, the user interface 16 or the like, adjusts the volume by adjusting the volume at which the audio file is output such that the track representative of the respective instrument for which the audio signals are dominant has an average volume above the environment audio volume that is consistent with, such as the same as, the average volume above the environment audio volume at which the tracks representative of the respective instrument for which the audio signals are dominant have been previously output. Thus, the apparatus, such as the processor, of this example embodiment maintains the volume at which the audio file is output such that the audio signals attributable to the instrument that is dominant remain above the environment audio volume by the same amount that audio signals attributable to the instrument that is dominant have historically been output relative to the environment audio volume for the same or other audio files for which the same instrument is dominant. By way of example, a user may have historically output audio files for which the guitar was the dominant instrument at a volume that exceeds the environment audio volume by an average of 3 dB. Thus, the apparatus of an example embodiment may cause an audio file for which the guitar is the dominant instrument to be output at a volume that exceeds the current environment audio volume by the same amount, that is, by 3 dB.

In this embodiment, the apparatus 10, such as the processor 12, of this example embodiment adjusts the output of the audio file and not just the volume of the audio signals attributable to the instrument that is dominant to establish the desired relationship with respect to the environment audio volume. Thus, the apparatus, such as the processor, of an example embodiment adjust the volume by adjusting the volume of tracks representative of instruments other than the respective instrument for which the audio signals are dominant based upon the average volume above an environment audio volume at which tracks representative of the respective instrument for which the audio signals are dominant have been previously output. Thus, in an instance in which the volume at which the audio file is output must be increased in order to maintain the volume of the audio signals attributable to the instrument that is dominant at the average level above the environment audio volume, the volume of the audio signals attributable to the other, non-dominant instruments are also proportionately increased. Conversely, in an instance in which the volume at which the audio file is output must be decreased in order to maintain the volume of the audio signals attributable to the instrument that is dominant at the average level above the environment audio volume, the volume of the audio signals attributable to the other, non-dominant instruments are also proportionately decreased.

As shown in FIG. 5, the apparatus 10 of an alternative embodiment may be configured to adjust the volume at which the audio file is output based upon the representation of the volume at which the user has previously output one or more audio files for which the audio signals attributable to the instrument are the loudest, as opposed to the most dominant. In this regard, the apparatus includes means, such as the processor 12 or the like, for separating an audio file into a plurality of tracks that each include audio signals attributable to a different respective instrument, and means, such as the processor or the like, for recognizing the instruments associated with each different track. See blocks 80 and 82 of FIG. 5. The method of this example embodiment also includes means, such as the processor or the like, for determining the instrument for which the audio signals are the loudest from among the tracks into which the audio file is separated (see block 84) and means, such as the processor or the like, for determining a representation of the volume at which the user previously output one or more audio files for which the audio signals attributable to the instrument are the loudest. By way of example, the apparatus of an example embodiment includes means, such as the processor or the like, for determining the representation of the volume by determining an average volume above an environment audio volume at which tracks representative of the respective instrument at which the audio signals were the loudest have been previously output, such as by reference to a database as shown in block 88. In embodiments that take the environment audio volume into account, the apparatus may include or be in communication with means, such as a microphone, for determining the environment audio volume. See block 86.

The apparatus 10 of this example embodiment also includes means, such as the processor 12, the user interface 16 or the like, for adjusting the volume at which the audio file is output based upon the representation of the volume at which the user has previously output one or more audio files for which the audio signals attributable to the instrument are the loudest. See block 90. For example, the apparatus, such as the processor, is configured to adjust the volume by adjusting the volume at which the audio file is output such that the track representative of the respective instrument for which the audio signals are the loudest has the average volume above the environment audio volume that has been determined.

Regardless of whether the dominant or the loudest instrument is determined and is utilized as a point of reference with respect to the adjustment of the volume for the audio file, the method, apparatus and computer program product of this example embodiment generally result in audio files, such as songs, that have a dominant instrument that the user favors being played at a greater volume than audio files, such as songs, that have a different dominant instrument that the user does not favor. In instances in which an audio file is divided into segments, the foregoing process may be repeated for each segment of the audio file.

In yet another example embodiment, a method, apparatus 10 and computer program product are provided for providing audio dynamic range compression based upon user input relating to the volume at which an audio file, such as a song, is output. In this regard, the apparatus of an example embodiment includes means, such as the processor 12 or the like, for determining the compression of an audio file. See block 10 of FIG. 6. Although the compression may be determined in various manners, the apparatus, such as the processor, is configured to determine the compression in accordance with an example embodiment by dividing the audio file into a plurality of segments and then determining the compression as the difference between the loudest segment and the quietest segment. In an example embodiment, one or more of the segments that fail to satisfy a qualification criteria may be discarded prior to determining the compression with the compression then determined as the difference between the loudest segment and the quietest segments of the segments that remain following discarding of those segment(s) that fail to satisfy the qualification criteria. The qualification criteria may be defined in various manners, such as a predefined threshold below full scale, such as 80 dB below full scale, such that the quietest segments are discarded prior to determining the compression.

The apparatus 10 of this example embodiment also includes means, such as the processor 12 or the like, for determining whether a user increases the volume in an instance in which an audio file is output quietly so as to satisfy a quiet threshold and whether a user decreases the volume in an instance in which the audio file is output loudly so as to satisfy the loudness threshold. The quiet threshold and the loudness threshold may be defined in different manners. For example, quiet threshold may be satisfied in an instance in which the audio file was output at the volume that is less than an average loudness of at least a portion of the audio file. In this regard, the portion of the audio file that is considered in regards to deteimining the average loudness may be the entire audio file or that portion of the audio file proximate the current location within the audio file that is being output, such as the immediately preceding 30 seconds or some other predefined period of time immediately preceding the current location at which the audio signals of the audio file are being output. Correspondingly, the loudness threshold may be satisfied in an instance in which the audio file was output at a volume that is greater than an average loudness of at least a portion of the audio file, such as the entire audio file or that portion of the audio file proximate the current location at which the audio signals are being output. In various embodiments, the quiet threshold and the loudness threshold may be predefined or may be based upon the environment audio volume. In an instance in which the user increases the volume in an instance in which the audio file is output quietly and decreases the volume in an instance in which the audio file is output loudly, the apparatus includes means, such as the processor or the like, for increasing the compression of the audio file. See block 104. In this regard, the audio file may be increasingly compressed by a predefined amount, such as by 1 dB, in response to each different input provided by the user that changes the volume at which the audio file is output.

As shown in block 108 of FIG. 6, the apparatus 10 of this example embodiment also includes means, such as the processor 12 or the like, for determining whether the user decreases volume in an instance in which the audio file is output quietly, such as to satisfy the quiet threshold, and increases the volume in an instance in which the audio file is output loudly, such as to satisfy the loudness threshold. In an instance in which the user decreases volume in an instance in which the audio file is output quietly and increases the volume in an instance in which the audio file is output loudly, the apparatus of an example embodiment includes means, such as the processor or the like, for reducing the compression of the audio file. See block 108. As described above, the audio file may have a compression that is reduced by a predefined amount, such as by 1 dB, in response to each different input provided by the user that changes the volume at which the audio file is output.

The compression may be increased or reduced from a predefined compression, such as defined by the user or by the producer of the audio file. The predefined compression of the audio file, if not defined by the metadata or other data associated with the audio file, may be determined as described above in conjunction with block 100 of FIG. 6. In some example embodiments, the predefined compression is dependent upon the genre of the audio file, such as by providing for more or less predefined compression in conjunction with audio files of a rock genre, a classical genre, a talk radio genre, etc. Additionally or alternatively, the predefined compression may be dependent upon an environment audio volume, such as recorded by a microphone and determined by the apparatus 10, such as the processor 12. For example, greater levels of predefined compression may be provided in an instance in which the background noise level is greater than instances in which the background noise level is lesser. By way of example, the predefined compression may be dependent on both the genre of the audio file and the environment audio volume, such as illustrated by the following example:

| Genre | Environment Audio Volume | Predefined Compression |
|---|---|---|
| Rock | <60 dB | Medium |
| Rock | >60 dB | Strong |
| Classical | <60 dB | None |
| Classical | >60 dB | Medium |

Although genre and environment audio volume are provided as examples, the apparatus 10, such as the processor 12, of this example embodiment may take other factors into consideration in the determination as to whether the level of compression should be altered. Other factors may include one or more of the location of the user, e.g., place of business, home or vehicle, based upon global positioning system (GPS) location data or data or route analysis, the type of system, if any, to which the audio player is connected, such as a home stereo or a vehicular audio system, the type of content, e.g., speech or music content, the detection of conversation in the proximity and/or the identification of a preferred song or speaker. As such, the audio file may be compressed based upon user input in terms of changes to the volume, as well as one or more of the foregoing factors.

As such, the method, apparatus 10 and computer program product of this example embodiment may determine from the manner in which the user adjusts the volume at which an audio file is output as to whether the user actually desires a different level of compression and, in response, automatically adjusts the compression accordingly. In instances in which the audio file is divided into segments, the foregoing process may be repeated for each segment.

As described above, FIGS. 2-6 illustrate flowcharts of an apparatus 10, method, and computer program product according to example embodiments of the invention. It will be understood that each block of the flowcharts, and combinations of blocks in the flowcharts, may be implemented by various means, such as hardware, firmware, processor, circuitry, and/or other devices associated with execution of software including one or more computer program instructions. For example, one or more of the procedures described above may be embodied by computer program instructions. In this regard, the computer program instructions which embody the procedures described above may be stored by the memory device 14 of an apparatus employing an embodiment of the present invention and executed by the processor 12 of the apparatus. As will be appreciated, any such computer program instructions may be loaded onto a computer or other programmable apparatus (e.g., hardware) to produce a machine, such that the resulting computer or other programmable apparatus implements the functions specified in the flowchart blocks. These computer program instructions may also be stored in a computer-readable memory that may direct a computer or other programmable apparatus to function in a particular manner, such that the instructions stored in the computer-readable memory produce an article of manufacture the execution of which implements the function specified in the flowchart blocks. The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart blocks.

Accordingly, blocks of the flowcharts support combinations of means for performing the specified functions and combinations of operations for performing the specified functions for performing the specified functions. It will also be understood that one or more blocks of the flowcharts, and combinations of blocks in the flowcharts, can be implemented by special purpose hardware-based computer systems which perform the specified functions, or combinations of special purpose hardware and computer instructions.

In some embodiments, certain ones of the operations above may be modified or further amplified. Furthermore, in some embodiments, additional optional operations may be included. Modifications, additions, or amplifications to the operations above may be performed in any order and in any combination.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A method comprising:
   separating an audio file into a plurality of tracks, each track comprises audio signals attributable to a different respective instrument;
   determining the instrument for which the audio signals are dominant or loudest from among the tracks into which the audio file is separated;
   dependent upon a determination of the instrument for which the audio signals are dominant or loudest during or after provision of user input to alter a volume at which the audio file is output, modifying a setting for a volume preference of the audio signals attributable to the instrument that is dominant or loudest based on the user input altering the volume at which the audio file is output without modification of the setting for the volume preference of the audio signals attributable to another instrument; and
   amplifying or attenuating audio signals based upon the setting for the volume preference, as modified.

2. A method according to claim 1 wherein modifying the setting comprises modifying the setting for the volume preference of the audio signals attributable to the instrument that is dominant or loudest in accordance with a direct relationship with respect to the user input.

3. A method according to claim 1 wherein modifying the setting comprises modifying the setting for the volume preference of the audio signals attributable to the instrument that is dominant or loudest by a fixed amount in response to the user input.

4. A method according to claim 1 wherein amplifying or attenuating the audio signals comprises amplifying or attenuating the audio signals representative of the instrument for which the audio signals were dominant or loudest without amplifying or attenuating the audio signals representative of the another instrument.

5. A method according to claim 1 wherein the audio file comprises a plurality of segments such that the plurality of tracks each correspondingly include a plurality of track segments, wherein determining the instrument for which the audio signals are dominant or loudest, modifying the setting for the volume preference of the audio signals attributable to the instrument that is dominant or loudest and amplifying or attenuating the audio signals are repeated for the plurality of segments of the audio file.

6. An apparatus comprising at least one processor and at least one memory including computer program code, the at least one memory and the computer program code configured to, with the at least one processor, cause the apparatus to:
   separate an audio file into a plurality of tracks, each track comprises audio signals attributable to a different respective instrument;
   determine the instrument for which the audio signals are dominant or loudest from among the tracks into which the audio file is separated;
   dependent upon a determination of the instrument for which the audio signals are dominant or loudest during or after provision of user input to alter a volume at which the audio file is output, modify a setting for a volume preference of the audio signals attributable to the instrument that is dominant or loudest based on the user input altering the volume at which the audio file is output without modification of the setting for the volume preference of the audio signals attributable to another instrument; and
   amplify or attenuate audio signals based upon the setting for the volume preference, as modified.

7. An apparatus according to claim 6 wherein the at least one memory and the computer program code are configured to, with the at least one processor, cause the apparatus to modify the setting by modifying the setting for the volume preference of the audio signals attributable to the instrument that is dominant or loudest in accordance with a direct relationship with respect to the user input.

8. An apparatus according to claim 6 wherein the at least one memory and the computer program code are configured to, with the at least one processor, cause the apparatus to modify the setting by modifying the setting for the volume preference of the audio signals attributable to the instrument that is dominant or loudest by a fixed amount in response to the user input.

9. An apparatus according to claim 6 wherein the at least one memory and the computer program code are configured to, with the at least one processor, cause the apparatus to amplify or attenuate the audio signals by amplifying or attenuating the audio signals representative of the instrument for which the audio signals were dominant or loudest without amplifying or attenuating the audio signals representative of the another instrument.

10. An apparatus according to claim 6 wherein the audio file comprises a plurality of segments such that the plurality of tracks each correspondingly include a plurality of track segments, wherein the at least one memory and the computer program code are configured to, with the at least one processor, cause the apparatus to repeatedly determine the instrument for which the audio signals are dominant or loudest, modify the setting for volume preference of the audio signals attributable to the instrument that is dominant or loudest and amplify or attenuate the audio signals for the plurality of segments of the audio file.

11. A method comprising:
separating an audio file into a plurality of tracks, each track comprises audio signals attributable to a different respective instrument;
determining the instrument for which the audio signals are dominant or loudest from among the tracks into which the audio file is separated;
determining a representation of a volume at which a user has previously output one or more audio files for which the audio signals attributable to the instrument are dominant or loudest; and
adjusting a volume at which the audio file is output based upon the representation of the volume at which the user has previously output one or more audio files for which the audio signals attributable to the instrument are dominant or loudest.

12. A method according to claim 11 wherein determining a representation of the volume comprises determining an average volume above an environment audio volume at which tracks representative of the respective instrument for which the audio signals that are dominant or loudest have been previously output.

13. A method according to claim 12 further comprising determining the environment audio volume, and wherein adjusting the volume comprises adjusting the volume at which the audio file is output such that the track representative of the respective instrument for which the audio signals are dominant or loudest has the average volume about the environment audio volume that is determined.

14. A method according to claim 13 wherein adjusting the volume comprises adjusting the volume of tracks representative of instruments other than the respective instrument for which the audio signals are dominant or loudest based upon the average volume above the environment audio volume at which tracks representative of the respective instrument for which the audio signals are dominant or loudest have been previously output.

15. A method according to claim 12 further comprising updating a database to store the average volume above the environment audio volume at which tracks representative of the respective instrument for which the audio signals are dominant or loudest have been previously output.

16. An apparatus comprising at least one processor and at least one memory including computer program code, the at least one memory and the computer program code configured to, with the at least one processor, cause the apparatus to:
separate an audio file into a plurality of tracks, each track comprises audio signals attributable to a different respective instrument;
determine the instrument for which the audio signals are dominant or loudest from among the tracks into which the audio file is separated;
determine a representation of a volume at which a user has previously output one or more audio files for which the audio signals attributable to the instrument are dominant or loudest; and
adjust a volume at which the audio file is output based upon the representation of the volume at which the user has previously output one or more audio files for which the audio signals attributable to the instrument are dominant or loudest.

17. An apparatus according to claim 16 wherein the at least one memory and the computer program code are configured to, with the at least one processor, cause the apparatus to determine a representation of the volume by determining an average volume above an environment audio volume at which tracks representative of the respective instrument for which the audio signals that are dominant or loudest have been previously output.

18. An apparatus according to claim 17 wherein the at least one memory and the computer program code are further configured to, with the at least one processor, cause the apparatus to determine the environment audio volume, and wherein the at least one memory and the computer program code are configured to, with the at least one processor, cause the apparatus to adjust the volume by adjusting the volume at which the audio file is output such that the track representative of the respective instrument for which the audio signals are dominant or loudest has the average volume about the environment audio volume that is determined.

19. An apparatus according to claim 18 wherein the at least one memory and the computer program code are configured to, with the at least one processor, cause the apparatus to adjust the volume by adjusting the volume of tracks representative of instruments other than the respective instrument for which the audio signals are dominant or loudest based upon the average volume above the environment audio volume at which tracks representative of the respective instrument for which the audio signals are dominant or loudest have been previously output.

20. An apparatus according to claim 17 wherein the at least one memory and the computer program code are further configured to, with the at least one processor, cause the apparatus to update a database to store the average volume above the environment audio volume at which tracks representative of the respective instrument for which the audio signals are dominant or loudest have been previously output.

* * * * *